(12) United States Patent
Baliga

(10) Patent No.: US 10,355,132 B2
(45) Date of Patent: Jul. 16, 2019

(54) POWER MOSFETS WITH SUPERIOR HIGH FREQUENCY FIGURE-OF-MERIT

(71) Applicant: North Carolina State University, Raleigh, NC (US)

(72) Inventor: Bantval Jayant Baliga, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 15/925,826

(22) Filed: Mar. 20, 2018

(65) Prior Publication Data

US 2018/0269322 A1    Sep. 20, 2018

Related U.S. Application Data

(60) Provisional application No. 62/473,761, filed on Mar. 20, 2017, provisional application No. 62/526,192, filed on Jun. 28, 2017, provisional application No. 62/624,989, filed on Feb. 1, 2018.

(51) Int. Cl.
| | |
|---|---|
| *H01L 29/78* | (2006.01) |
| *H01L 29/66* | (2006.01) |
| *H01L 29/423* | (2006.01) |
| *H01L 29/16* | (2006.01) |

(52) U.S. Cl.
CPC ...... *H01L 29/7836* (2013.01); *H01L 29/1608* (2013.01); *H01L 29/42376* (2013.01); *H01L 29/6656* (2013.01); *H01L 29/6659* (2013.01); *H01L 29/66666* (2013.01); *H01L 29/7827* (2013.01); *H01L 29/7811* (2013.01); *H01L 29/7823* (2013.01)

(58) Field of Classification Search
CPC ........... H01L 29/7836; H01L 29/42376; H01L 29/6656; H01L 29/6659; H01L 29/66666; H01L 29/7827; H01L 29/7811; H01L 29/7823
See application file for complete search history.

(56) References Cited

U.S. PATENT DOCUMENTS

| | | | |
|---|---|---|---|
| 7,919,824 B2* | 4/2011 | Ono | H01L 29/0634 257/367 |
| 8,013,360 B2* | 9/2011 | Saito | H01L 29/872 257/197 |
| 9,281,392 B2* | 3/2016 | Weyers | H01L 29/0634 |

(Continued)

*Primary Examiner* — Ida M Soward
(74) *Attorney, Agent, or Firm* — Myers Bigel, P.A.

(57) ABSTRACT

An insulated-gate field effect transistor includes a substrate having a drift region and a source region of first conductivity type, and a base region and shielding region of second conductivity type therein. The base region forms a first P-N junction with the source region and the shielding region extends between the drift region and the base region. A transition region of first conductivity type is provided, which is electrically coupled to the drift region. The transition region extends between a first surface of the substrate and the shielding region, and forms a second P-N junction with the base region. An insulated gate electrode is provided on a first surface of the substrate. The insulated gate electrode has an electrically conductive gate therein with a drain-side sidewall extending intermediate the second P-N junction and an end of the shielding region when viewed in transverse cross-section.

22 Claims, 15 Drawing Sheets

(56) References Cited

U.S. PATENT DOCUMENTS

| | | | | |
|---|---|---|---|---|
| 9,947,741 B2* | 4/2018 | Schulze | ............. | H01L 29/7823 |
| 10,109,725 B2* | 10/2018 | Storasta | ............. | H01L 29/7395 |
| 2010/0007782 A1* | 1/2010 | Segami | ................ | H04N 3/1568 |
| | | | | 348/311 |
| 2014/0284701 A1* | 9/2014 | Korec | ................. | H01L 29/7824 |
| | | | | 257/328 |
| 2015/0162432 A1* | 6/2015 | Kumagai | ............ | H01L 29/0684 |
| | | | | 257/77 |
| 2015/0333177 A1* | 11/2015 | Zhang | ................ | H01L 29/0847 |
| | | | | 257/343 |
| 2017/0194438 A1* | 7/2017 | Kumagai | ............ | H01L 29/0865 |

* cited by examiner

US 10,355,132 B2

POWER MOSFETS WITH SUPERIOR HIGH FREQUENCY FIGURE-OF-MERIT

REFERENCE TO PRIORITY APPLICATIONS

This application claims priority to U.S. Provisional Application Ser. No. 62/473,761, filed Mar. 20, 2017, U.S. Provisional Application Ser. No. 62/526,192, filed Jun. 28, 2017, and U.S. Provisional Application Ser. No. 62/624,989, filed Feb. 1, 2018, the disclosures of which are hereby incorporated herein by reference.

STATEMENT OF U.S. GOVERNMENT INTEREST

This invention was made with Government support under Grant No. DE-EE0006521 awarded by the Department of Energy. The Government has certain rights in the invention.

FIELD OF THE INVENTION

The present invention relates to semiconductor devices and methods of forming same and, more particularly, to power semiconductor devices and methods of forming same.

SUMMARY OF THE INVENTION

Current embodiments of the invention include power insulated-gate field effect transistors having predominately planar I-V characteristics with voltage-supporting vertical conduction provided to a backside drain contact. In particular, a novel SiC (or GaN) power MOSFET cell topology is disclosed with improved high frequency figure-of-merit (HFFOM). This is important because SiC power MOSFETs are being commercialized for applications in power electronics at higher frequencies than possible using silicon IGBTs. As will be understood by those skilled in the art, SiC devices with higher HFFOM reduce power losses and thereby improve device efficiency. Advantageously, the proposed SiC power MOSFETs can be fabricated using standard manufacturing technologies, including those available in the PowerAmerica foundry X-Fab. Current state-of-the-art SiC MOSFETs being manufactured by leading manufacturers (e.g., Cree-Wolfspeed) can have a HFFOM (e.g., (Ron)×(Qgd)) of 1382, whereas the proposed devices described herein may have a HFFOM of only about 93, which represents an improvement of about 15 times.

According to some of these embodiments of the invention, a power transistor may include a substrate having a semiconductor drift region of first conductivity type (e.g., N-type SiC, N-type GaN) and a semiconductor source region of first conductivity type therein. A semiconductor base region of second conductivity type (e.g., P-type SiC, P-type GaN) is also provided in the substrate. This base region forms a first P-N junction with the source region. A semiconductor shielding region of second conductivity type is provided, which extends between the drift region and the base region and has a greater lateral extent within the substrate relative to the base region. A semiconductor transition region of first conductivity type is provided in the substrate and is electrically coupled to the drift region. The transition region extends between a first surface of the substrate and the shielding region, and forms a second P-N junction with the base region. An insulated gate electrode is provided on the first surface of the substrate. The insulated gate electrode has an electrically conductive gate therein with a drain-side sidewall extending intermediate the second P-N junction and an end of the shielding region when viewed in transverse cross-section.

According to additional embodiments of the invention, a junction field effect transistor (JFET) region of first conductivity type may be provided, which extends between the drift region and the first surface. According to these embodiments of the invention, the transition region forms a non-rectifying semiconductor junction with a first portion of the JFET region. In addition, a net first conductivity type doping concentration in the transition region is greater than a net first conductivity type doping concentration in the first portion of the JFET region. In particular, the net first conductivity type doping concentration in a first portion of the transition region extending between the first surface and the shielding region is sufficiently high to prevent full depletion of the first portion of the transition region when the transistor is turned-off.

According to additional embodiments of the invention, the first portion of the transition region forms a third P-N junction with the shielding region. Preferably, a thickness ($t_T$) of the first portion of the transition region, as measured between the first surface and the shielding region is: (i) greater than $0.75(2V_{bi}\varepsilon_s/qN_T)^{1/2}$, where $V_{bi}$ is the built-in potential of the third P-N junction, $\varepsilon_s$ is the dielectric constant of the transition region, q is the electron charge and $N_T$ is the net first conductivity type doping concentration in the transition region, and (ii) less than $E_c\varepsilon_s/qN_T$, where $E_c$ is the critical electric field for breakdown in the transition region.

According to still further embodiments of the invention, the first portion of the JFET region extends to the first surface and the non-rectifying semiconductor junction between the transition region and the first portion of the JFET region extends to the first surface. The transition region may also extend between the shielding region and the first surface, but the first portion of the JFET region does not extend between the shielding region and the first surface. The JFET region may also form a fourth P-N junction with the shielding region and the transition region may extend between the fourth P-N junction and the first surface.

In addition, a source electrode extension may be provided, which is disposed adjacent a drain-side end of the gate and opposite the transition region. This source electrode extension is electrically coupled to the source region by a source electrode. The source electrode extension and the gate may be formed at the same time during processing and of the same material (e.g., polysilicon). A separation distance between the gate and the base region may also be equivalent to a separation distance between the source electrode extension and the transition region. Preferably, the source electrode extension is patterned so that a portion of the source electrode extension extends opposite an end of the shielding region and closely adjacent a drain-side end of the gate electrode. Based on this configuration, the source electrode extension can operate to at least partially shield a drain-side end of the gate electrode from the transition region, so that a gate transfer capacitance (Cgd) and a gate transfer charge (Qgd) can be reduced.

According to still further embodiments of the invention, an insulated-gate field effect transistor includes a substrate having semiconductor drift and source regions of first conductivity type and a semiconductor base region of second conductivity type therein. The base region forms a first P-N junction with the source region. A semiconductor shielding region of second conductivity type is provided in the substrate. This shielding region extends between the drift region and the base region and has a greater lateral extent within the substrate relative to the base region. A semiconductor transition region of first conductivity type is also provided and is electrically coupled to the drift region. The transition region extends between a first surface of the substrate and the shielding region and forms a second P-N junction with the base region. An insulated gate electrode is provided on the first surface of the substrate. This insulated gate electrode has an electrically conductive gate therein with a drain-side sidewall extending closer to the second P-N junction relative to a laterally extending distal end of the shielding region, when viewed in transverse cross-section. A JFET region of first conductivity type may also be provided, which extends between the drift region and the first surface. The transition region may also form a non-rectifying semiconductor junction with a first portion of the JFET region and a net first conductivity type doping concentration in the transition region may be greater than a net first conductivity type doping concentration in the first portion of the JFET region. In particular, the net first conductivity type doping concentration in a first portion of the transition region, which extends between the first surface and the shielding region, is sufficiently high to prevent full depletion of the first portion of the transition region when the transistor is fully turned-off. In addition, the first portion of the JFET region may extend to the first surface and the non-rectifying semiconductor junction between the transition region and the first portion of the JFET region may extend to the first surface. Furthermore, according to some of these embodiments of the invention, the transition region extends between the shielding region and the first surface, but the first portion of said JFET region does not extend between the shielding region and the first surface. The JFET region may also form a fourth P-N junction with the shielding region and the transition region may extend between the fourth P-N junction and the first surface.

According to still further embodiments of the invention, an insulated-gate field effect transistor is provided, which includes a substrate having a semiconductor drift region of first conductivity type and a semiconductor source region of first conductivity type therein. A semiconductor base region of second conductivity type is provided, which extends in the substrate and forms a first P-N junction with the source region. A semiconductor shielding region of second conductivity type is also provided in the substrate. This shielding region extends between the drift region and the base region and has a greater lateral extent within the substrate relative to the base region. A semiconductor transition region of first conductivity type is provided, which is electrically coupled to the drift region. The transition region extends between a first surface of the substrate and the shielding region and forms a second P-N junction with the base region. An insulated gate electrode is provided on the first surface of the substrate. The gate electrode has an electrically conductive gate therein that is shielded from the drift region along its entire length by the shielding region, which has a laterally extending distal end that forms a third P-N junction with the transition region and a fourth P-N junction with the drift region.

According to additional embodiments of the invention, a method of forming a vertical power device having an insulated-gate transistor therein is provided. This method includes forming a transition region by implanting transition region dopants of first conductivity type into a JFET region of first conductivity type extending adjacent a first surface of a semiconductor substrate, using a first implant mask to define a lateral extent of the transition region dopants within the JFET region. A base region may also be formed by implanting base region dopants of second conductivity type into the first surface of the substrate using a second implant mask. This base region forms a first P-N junction with the transition region. A shielding region is formed by implanting shielding region dopants of second conductivity type into the first surface of the substrate using a third implant mask to define a lateral extent of the shielding region dopants within the JFET region, which is greater than a lateral extent of the implanted base region dopants. An insulated gate electrode is formed on the first surface of the substrate. The insulated gate electrode has an electrically conductive gate therein with a drain-side sidewall. This drain-side sidewall extends closer to the first P-N junction relative to a laterally extending distal end of the shielding region, when viewed in transverse cross-section. According to preferred aspects of these embodiments of the invention, the shielding region is patterned to thereby form a non-rectifying junction with the base region, a second P-N junction with the transition region, which extends between the shielding region and the first surface, and a third P-N junction with the JFET region.

DETAILED DESCRIPTION OF EMBODIMENTS

Figure 1:
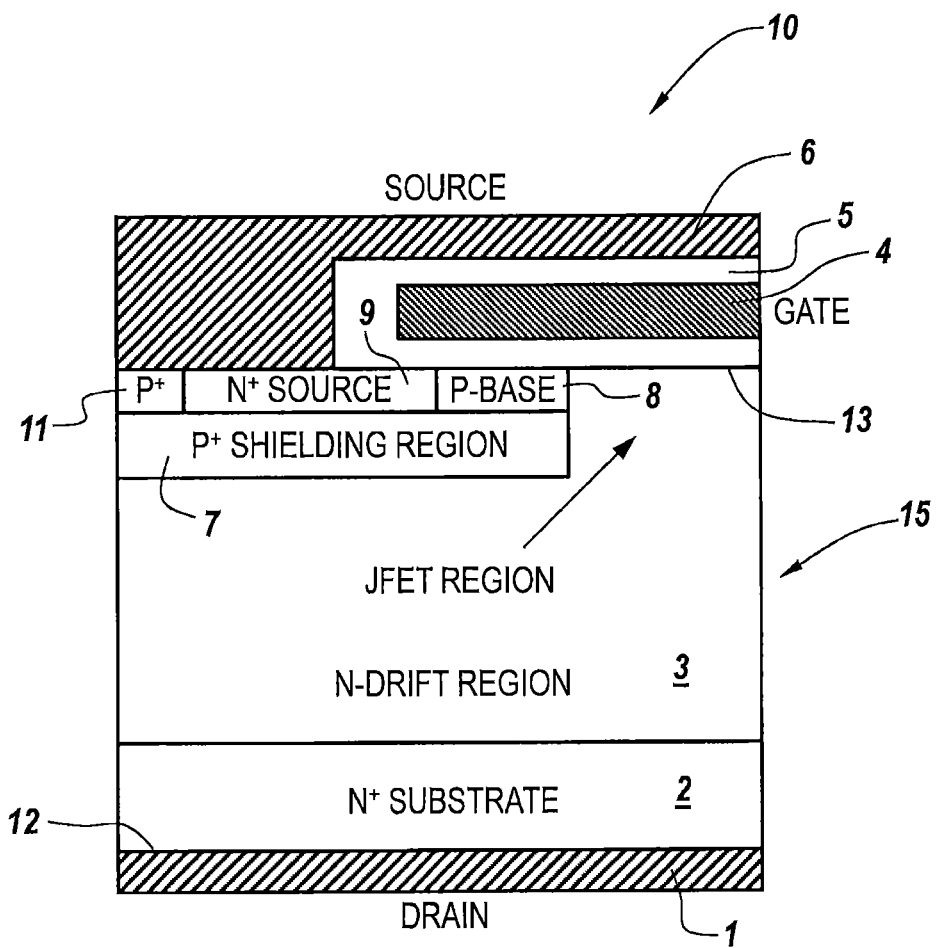
FIG. 1 is a cross-sectional view of an insulated-gate field effect transistor (e.g., half-cell) according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring now to FIG. 1, a silicon carbide (SiC) power MOSFET 10 according to the prior art is illustrated as including a semiconductor substrate 15 (e.g., SiC) having a "substrate" region 2 of first conductivity type (e.g., N-type) therein. This substrate region 2 (N+ substrate) is shown as a relatively highly doped region that may be derived from a relatively highly doped SiC material (e.g., SiC wafer/chip, SiC epitaxial layer). The semiconductor substrate 15 includes a relatively lightly doped N-type drift region 3 (N-Drift) that extends between the substrate region 2 and a first/primary surface 13 of the substrate 15, which has a source electrode 6 (Source) and a relatively wide and large area gate electrode 4 (Gate) thereon. This gate electrode 4 is insulated from surrounding regions by an electrically insulating region 5 (e.g., silicon dioxide).

A relatively highly doped "shielding" region 7 of second conductivity type (e.g., P-type) is provided in the drift region 3. This shielding region 7 is electrically coupled to the source electrode 6 by a contact region 11 of second conductivity type, which extends between the shielding region 7 and the first surface 13 of the substrate 15, as shown. The shielding region 7 and the contact region 11 are both shown as relatively highly doped P+ regions. A source region 9 of first conductivity type (N+ Source), which forms an ohmic contact with the source electrode 6, and a base region 8 of second conductivity type (P-base) are provided in the substrate 15. As shown, the N-type source region 9 and the P-type base region 8 extend between the shielding region 7 and the first surface 13 of the substrate 15. Furthermore, the P-type base region 8 and the P-type shielding region 7 are shown as having the same lateral extent in the drift region 3, when the MOSFET 10 is viewed in transverse cross-section, as shown.

As will be understood by those skilled in the art, the application of a sufficiently positive bias to the gate electrode 4 will "turn-on" the MOSFET 10 by inducing the formation of an N-type inversion layer channel in the P-type base region 8. This inversion layer channel, which forms adjacent the first surface 13 of the substrate 15, operates to electrically connect the source region 9 to the N-type drift region 3 so that forward on-state current may flow (laterally and vertically) between the source electrode 6 and drain electrode 1 of the MOSFET 10. In particular, during forward on-state conduction, majority carriers (i.e., electrons) may be provided laterally from the source region 9 to a "neck" region (a/k/a JFET region) within the drift region 3 and then vertically downward across the voltage-supporting drift region 3 to the substrate region 2 and drain electrode 1, which is provided on a second surface 12 of the substrate 15.

The lateral extent of the JFET "neck" region may be defined as the lateral width of the upper drift region 3, as measured between two adjacent P-type shielding regions 7. One of these P-type shielding regions 7 is illustrated by the "half-cell" MOSFET configuration of FIG. 1, which typically includes another mirror-image half-cell MOSFET that is responsive to the same gate electrode 4. Moreover, because of the gate electrode 4 is relatively wide and extends opposite the JFET "neck" region, the application of a sufficiently positive bias to the gate electrode 4 will operate to modulate (i.e., enhance) the conductivity of the JFET "neck" region to thereby advantageously lower an on-state resistance (Ron) of the MOSFET 10 at a cost of higher gate capacitance (Cgd) and slower switching speed. In particular, the relatively large overlap between the gate electrode 4 and the underlying drift region 3 causes an increase in gate transfer capacitance and gate transfer charge and a corresponding increase in a high-frequency figure-of-merit (HF-FOM) for the MOSFET 10. This higher HFFOM results in a higher switching power loss, which inhibits high frequency operation.

Figure 2A:
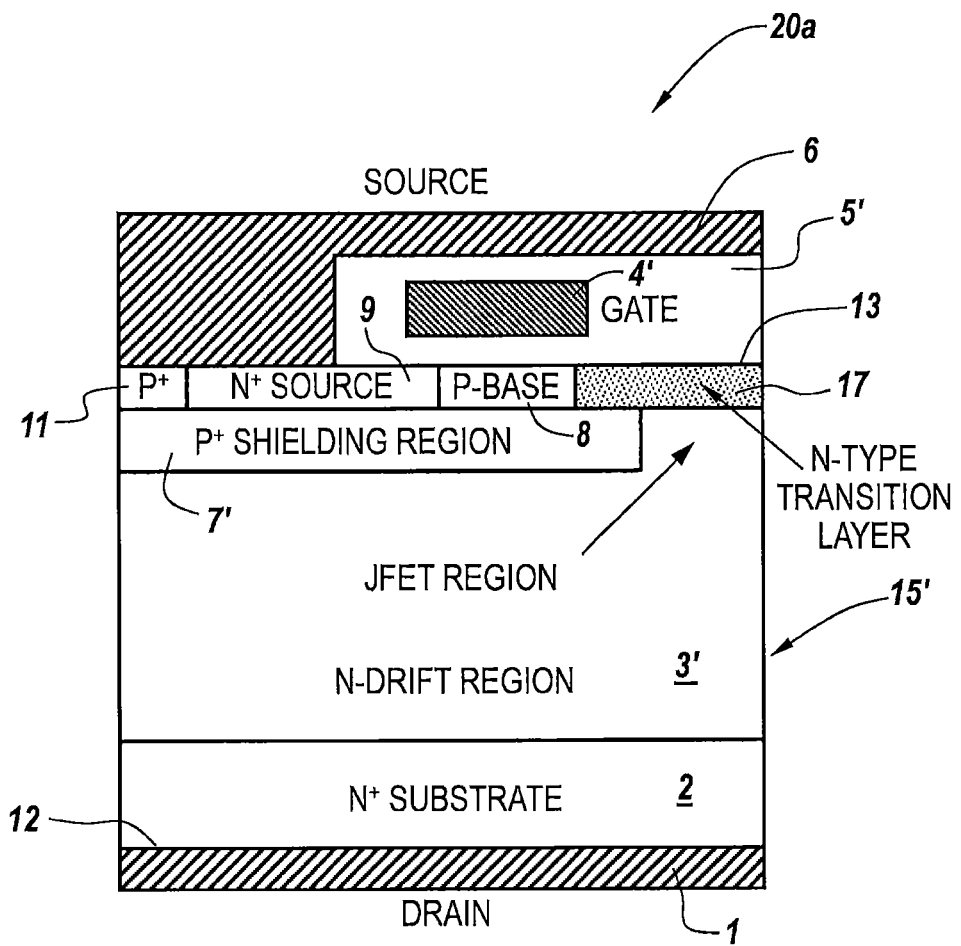
FIG. 2A is a cross-sectional view of an insulated-gate field effect transistor (e.g., half-cell) according to an embodiment of the invention.

Referring now to FIG. 2A, a silicon carbide (SiC) power MOSFET 20a according to an embodiment of the invention is illustrated as including a semiconductor substrate 15' (e.g., SiC) having a "substrate" region 2 of first conductivity type (e.g., N-type) therein. This substrate region 2 (N+ substrate) is shown as a relatively highly doped region that may be derived from a relatively highly doped SiC material (e.g., SiC wafer/chip, SiC epitaxial layer). The semiconductor substrate 15' further includes a relatively lightly doped N-type drift region 3' (N-Drift) that extends between the substrate region 2 and a first/primary surface 13 of the substrate 15', which has a source electrode 6 (Source) and an advantageously "short" gate electrode 4' (Gate) thereon. This gate electrode 4' is insulated from surrounding regions by an electrically insulating region 5' (e.g., silicon dioxide).

A relatively highly doped "shielding" region 7' of second conductivity type (e.g., P-type) is provided in the drift region 3'. This shielding region 7' is electrically coupled to the source electrode 6 by a contact region 11 of second conductivity type, which extends between the shielding region 7' and the first surface 13 of the substrate 15', as shown. The shielding region 7' and the contact region 11 are both shown as relatively highly doped P+ regions. A source region 9 of first conductivity type (N+ Source), which forms an ohmic contact with the source electrode 6, a base region 8 of second conductivity type (P-base) and an N-type transition region/layer 17 are provided in the substrate 15'. As shown, the N-type source region 9 and the P-type base region 8 extend between the first surface 13 of the substrate 15' and the shielding region 7', which has a greater lateral extent relative to the base region 8.

However, as illustrated and explained more fully hereinbelow (see, e.g., FIGS. 4 and 6A-6G), only a portion of the N-type transition region/layer 17 extends between the shielding region 7' and the first surface 13 of the substrate 15'. Moreover, the P-N junction between the N-type transition region/layer 17 and the P-type base region 8 extends underneath the shortened gate electrode 4', which is electrically "shielded" from the underlying drift region 3' by the laterally extending shielding region 7'. This novel "shielding" benefit is achieved because the lateral extent (i.e., width) of the shielding region 7' is greater than the lateral extent of the gate electrode 4' (and base region 8), when the MOSFET 20a is viewed in transverse cross-section, as shown.

As will be understood by those skilled in the art, the application of a sufficiently positive bias to the gate electrode 4 will "turn-on" the MOSFET 20a by inducing the formation of an N-type inversion layer channel in the P-type base region 8 and accumulating majority carriers in the transition region/layer 17. This inversion layer channel, which forms adjacent the first surface 13 of the substrate 15', operates to electrically connect the source region 9 to the N-type drift region 3' (via the transition region/layer 17) so that forward on-state current may flow (laterally and vertically) between the source electrode 6 and drain electrode 1 of the MOSFET 20a. In particular, during forward on-state conduction, majority carriers (i.e., electrons) may be provided laterally from the source region 9 to the transition region/layer 17 and the "neck" region (JFET region) within the drift region 3' and then vertically across the voltage-supporting drift region 3' to the substrate region 2 and drain electrode 1, which is provided on a second surface 12 of the substrate 15'.

Figure 2B:
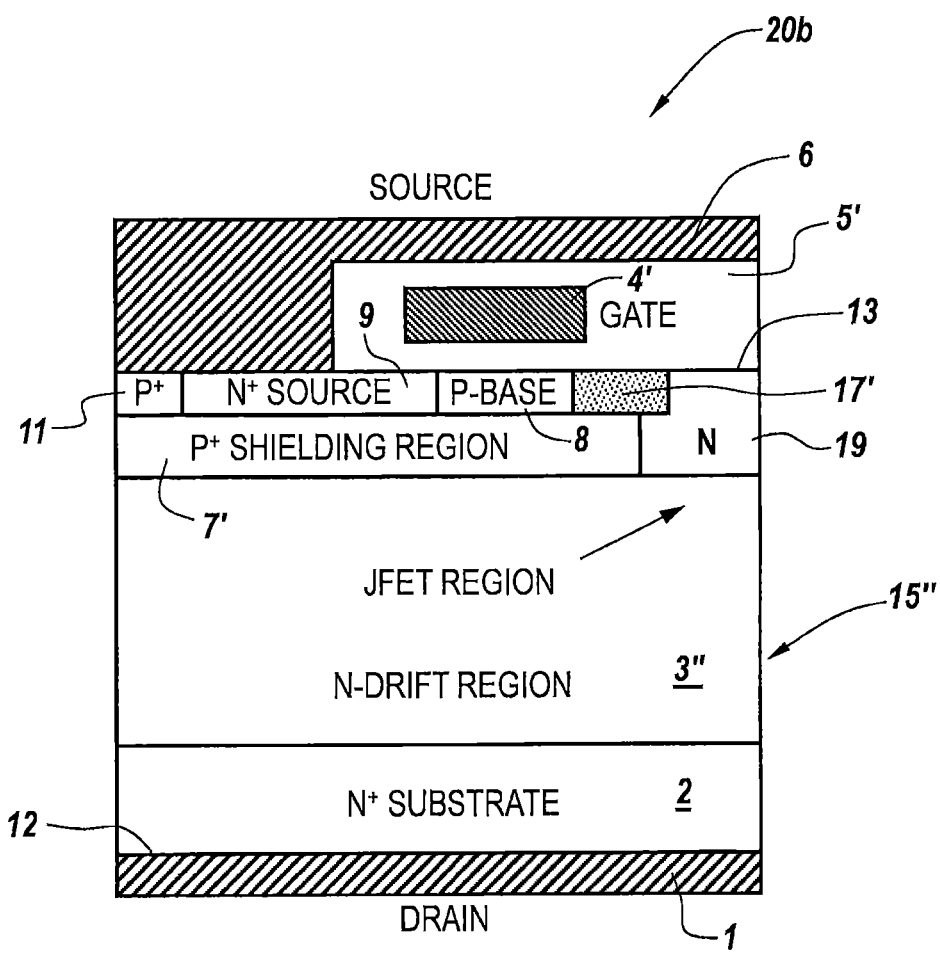
FIG. 2B is a cross-sectional view of an insulated-gate field effect transistor (e.g., half-cell) according to an embodiment of the invention.

Referring now to FIG. 2B, a silicon carbide (SiC) power MOSFET 20b according to another embodiment of the invention is illustrated as including a semiconductor substrate 15" (e.g., SiC) having a "substrate" region 2 of first conductivity type (e.g., N-type) therein. This substrate region 2 (N+ substrate) is shown as a relatively highly doped region that may be derived from relatively highly doped SiC material (e.g., SiC wafer/chip, SiC epitaxial layer). The semiconductor substrate 15" further includes a relatively lightly doped N-type drift region 3" (N-Drift) that extends between the substrate region 2 and a first/primary surface 13 of the substrate 15", which has a source electrode 6 (Source) and an advantageously "short" gate electrode 4' (Gate) thereon. This gate electrode 4' is insulated from surrounding regions by an electrically insulating region 5' (e.g., silicon dioxide).

A relatively highly doped "shielding" region 7' of second conductivity type (e.g., P-type) is provided in the drift region 3". This shielding region 7' is electrically coupled to the source electrode 6 by a contact region 11 of second conductivity type, which extends between the shielding region 7' and the first surface 13 of the substrate 15", as shown. The shielding region 7' and the contact region 11 are both shown as relatively highly doped P+ regions. A source region 9 of first conductivity type (N+ Source), which forms an ohmic contact with the source electrode 6, a base region 8 of second conductivity type (P-base), an N-type transition region 17' and a JFET neck region 19 are provided in the substrate 15". As shown, the N-type source region 9, the P-type base region 8 and a portion of the N-type transition region 17' extend between the shielding region 7' and the first surface 13 of the substrate 15". In addition, the JFET neck region 19, which is more highly doped relative to the drift region 3", but more lightly doped relative to the transition region 17', extends to the first surface 13 of the substrate 15", as illustrated, thereby truncating a lateral extent of the transition region 17' (relative to the transition region 17 of FIG. 2A).

As illustrated and explained more fully hereinbelow (see, e.g., FIGS. 5 and 7A-7G), only a portion of the N-type transition region 17' extends between the shielding region 7' and the first surface 13 of the substrate 15". Moreover, the P-N junction between the N-type transition region 17' and the P-type base region 8 extends underneath the shortened gate electrode 4', which is electrically "shielded" from the underlying drift region 3" by the laterally extending shielding region 7'.

As will be understood by those skilled in the art, the application of a sufficiently positive bias to the gate electrode 4 will "turn-on" the MOSFET 20b by inducing the formation of an N-type inversion layer channel in the P-type base region 8 and accumulating majority carriers in the transition region 17'. This inversion layer channel, which forms adjacent the first surface 13 of the substrate 15", operates to electrically connect the source region 9 to the N-type drift region 3" (via the transition region 17' and JFET region 19) so that forward on-state current may flow (laterally and vertically) between the source electrode 6 and drain electrode 1 of the MOSFET 20b. In particular, during forward on-state conduction, majority carriers (i.e., electrons) may be provided laterally from the source region 9 to the transition region 17' and the JFET neck region 19 and then vertically across the voltage-supporting drift region 3" to the substrate region 2 and drain electrode 1, which is provided on a second surface 12 of the substrate 15".

Figure 2C:
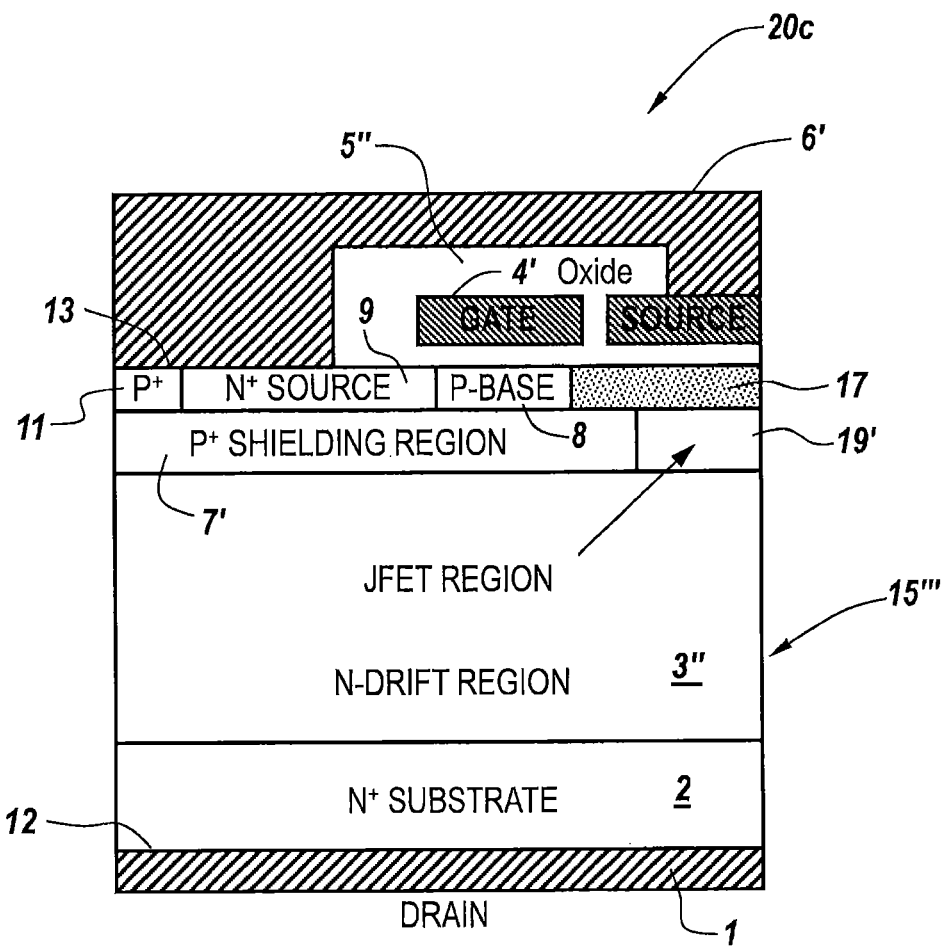
FIG. 2C is a cross-sectional view of an insulated-gate field effect transistor (e.g., half-cell) according to an embodiment of the invention.

Referring now to FIG. 2C, a silicon carbide (SiC) power MOSFET 20c according to another embodiment of the invention is illustrated as including a semiconductor substrate 15'" (e.g., SiC) having a "substrate" region 2 of first conductivity type (e.g., N-type) therein. This substrate region 2 (N+ substrate) is shown as a relatively highly doped region that may be derived from relatively highly doped SiC material (e.g., SiC wafer/chip, SiC epitaxial layer). The semiconductor substrate 15'" further includes a relatively lightly doped N-type drift region 3" (N-Drift) that extends between the substrate region 2 and a first/primary surface 13 of the substrate 15'", which has a source electrode 6' (Source), a source electrode extension 6a and an advantageously "short" gate electrode 4' (Gate) thereon. This gate electrode 4' is insulated from surrounding regions by an electrically insulating region 5' (e.g., silicon dioxide), which also separates and electrically isolates the source electrode extension 6a from the first surface 13, as shown.

A relatively highly doped "shielding" region 7' of second conductivity type (e.g., P-type) is provided in the drift region 3". This shielding region 7' is electrically coupled to the source electrode 6 (and source electrode extension 6a) by a contact region 11 of second conductivity type, which extends between the shielding region 7' and the first surface 13 of the substrate 15'", as shown. The shielding region 7' and the contact region 11 are both shown as relatively highly doped P+ regions. A source region 9 of first conductivity type (N+ Source), which forms an ohmic contact with the source electrode 6, a base region 8 of second conductivity type (P-base), an N-type transition region 17 and a JFET neck region 19' (underneath the transition region 17) are provided in the substrate 15'''. As shown, the N-type source region 9, the P-type base region 8 and a first portion of the N-type transition region 17 extend between the shielding region 7' and the first surface 13 of the substrate 15'', and a second portion of the N-type transition region 17 extends between the JFET neck region 19' and the first surface 13. The JFET neck region 19' is more highly doped relative to the drift region 3'', but more lightly doped relative to the transition region 17.

As illustrated and explained more fully hereinbelow (see, e.g., FIGS. 5 and 7A-7G), only a portion of the N-type transition region 17 extends between the shielding region 7' and the first surface 13 of the substrate 15'''. Moreover, the P-N junction between the N-type transition region 17 and the P-type base region 8 extends underneath the shortened gate electrode 4', which is electrically "shielded" from the underlying drift region 3'' by the laterally extending shielding region 7'. In addition, a drain-side end of the gate electrode 4' is at least partially shielded from the transition region (and underlying JFET region 19') by the laterally adjacent source electrode extension 6a, which may be formed of the same material as the gate electrode 4'. In this manner, the source electrode extension 6a, which can be defined at the same time as the gate electrode 4' (without requiring any additional process mask) operates to reduce the gate transfer capacitance (Cgd) and the gate transfer charge (Qgd).

As will be understood by those skilled in the art, the application of a sufficiently positive bias to the gate electrode 4' will "turn-on" the MOSFET 20c by inducing the formation of an N-type inversion layer channel in the P-type base region 8 and accumulating majority carriers in the transition region 17. This inversion layer channel, which forms adjacent the first surface 13 of the substrate 15''', operates to electrically connect the source region 9 to the N-type drift region 3'' (via the transition region 17 and JFET region 19') so that forward on-state current may flow (laterally and vertically) between the source electrode 6 and drain electrode 1 of the MOSFET 20c. In particular, during forward on-state conduction, majority carriers (i.e., electrons) may be provided laterally from the source region 9 to the transition region 17 and then vertically across the JFET neck region 19' and voltage-supporting drift region 3'' to the substrate region 2 and drain electrode 1, which is provided on a second surface 12 of the substrate 15'''.

Figure 3A:
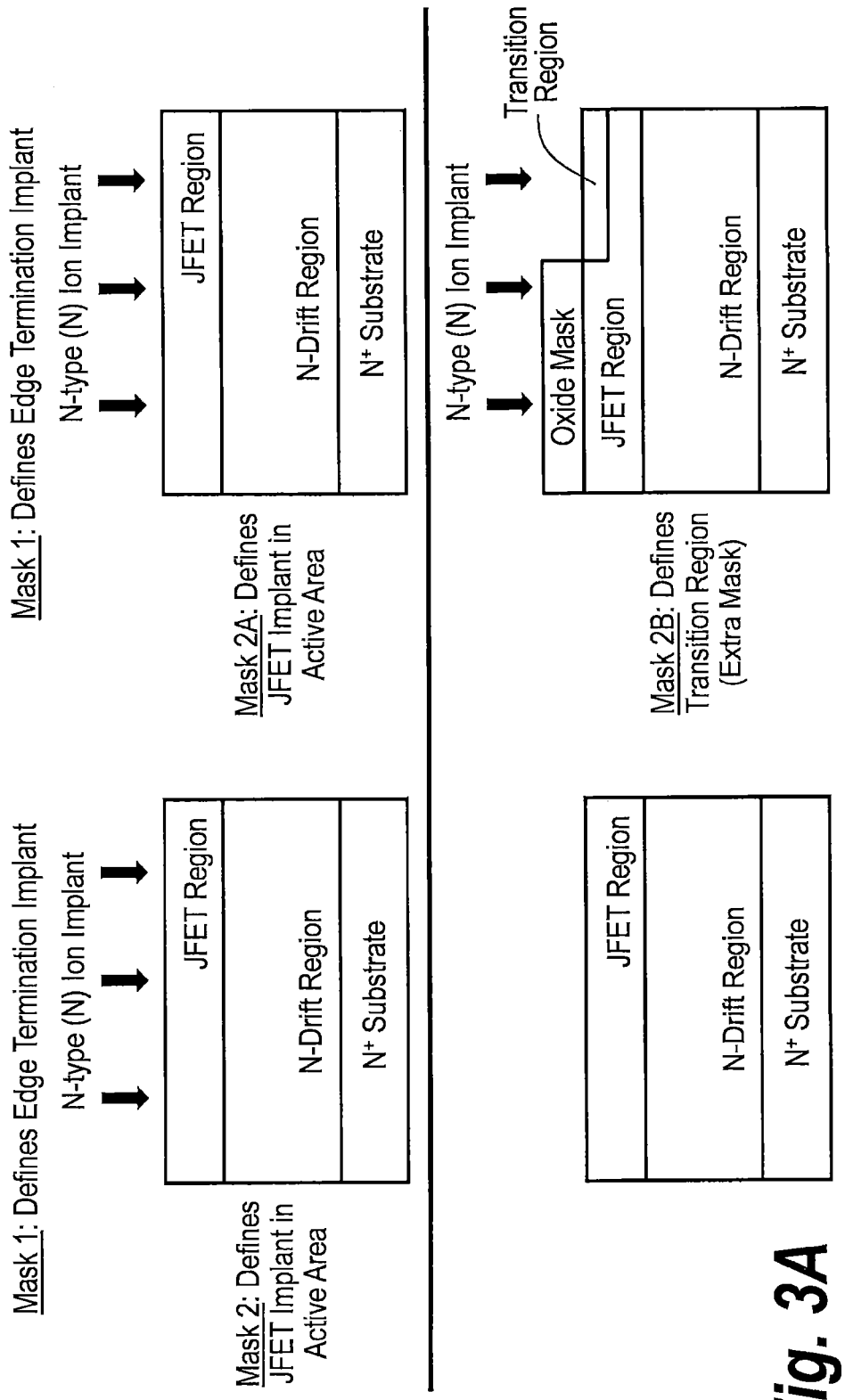
FIGS. 3A-3E are cross-sectional views of intermediate structures that illustrate methods of forming insulated-gate field effect transistors according to the prior art (left side) and according to embodiments of the invention (right side).

Referring now to FIGS. 3A-3E, a comparison of methods of forming the conventional MOSFET of FIG. 1 (with added N-type JFET neck region) and the novel MOSFET of FIG. 2B will be provided. In FIG. 3A, both methods include the use of Mask 1 and Mask 2 (or 2A) to define an edge termination implant (N-type) and an N-type JFET region implant (within a device active area) within a semiconductor substrate (e.g., SiC substrate) having an N-type drift region and N+ substrate region therein. However, as shown at the bottom and right side of FIG. 3A, an additional ion implant Mask 2B (e.g., oxide mask) is used to define a more highly doped and relatively shallow N-type transition region within a surface portion of the more lightly doped JFET region.

Figure 3B:
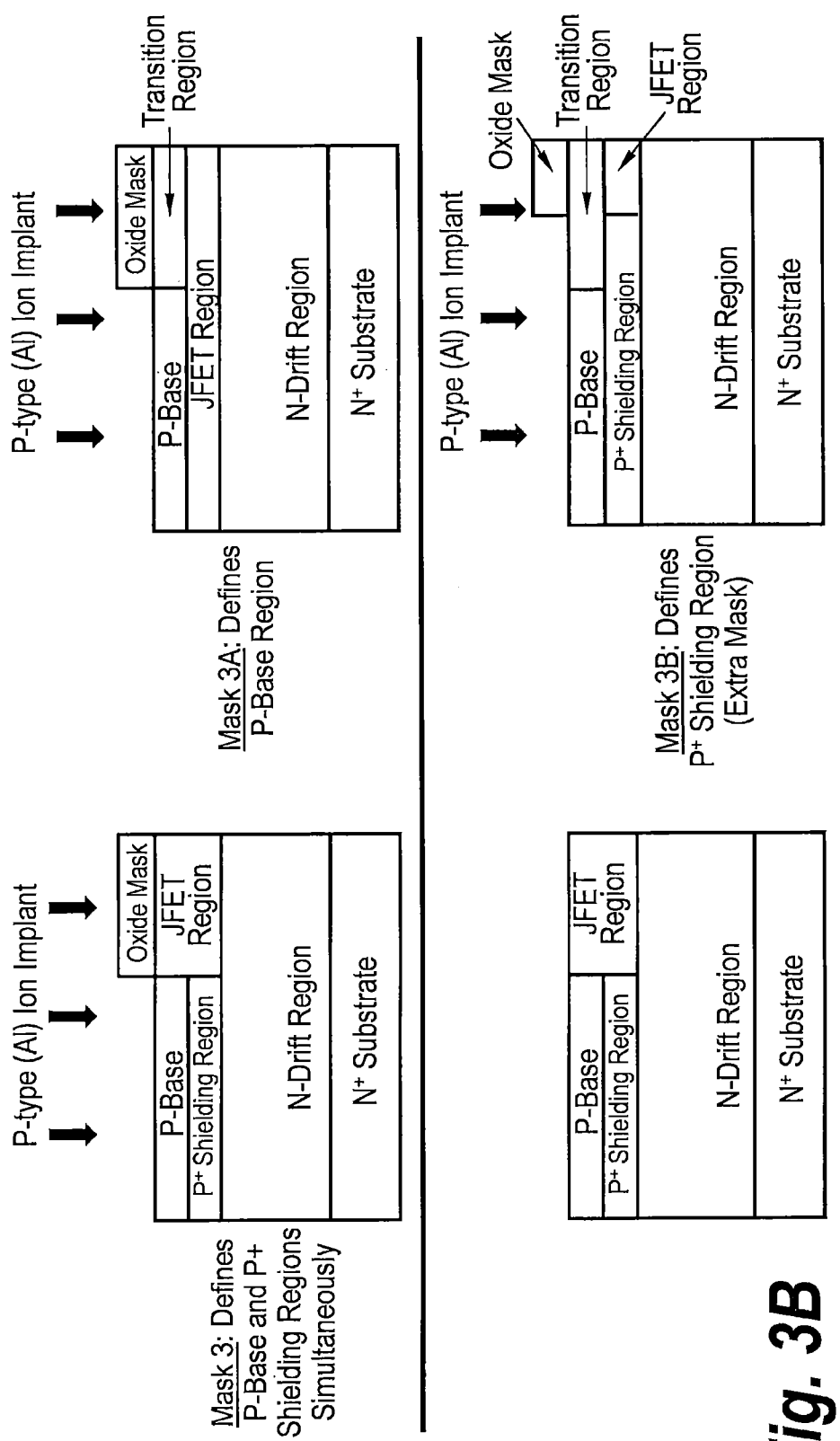
Figure 3C:
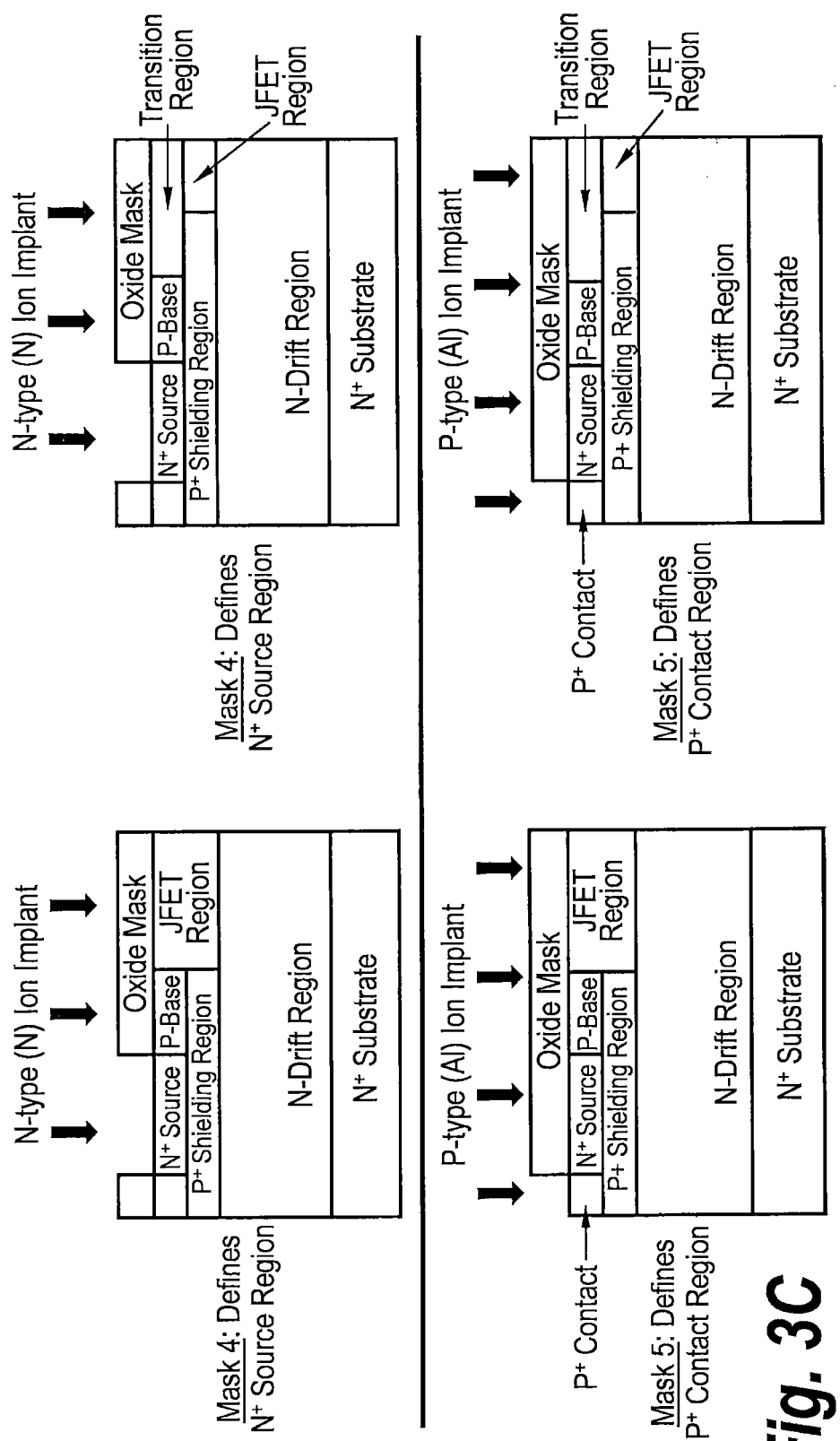

Thereafter, as shown by FIG. 3B, a Mask 3 is used to support the formation of conventional P-type base and P+ shielding regions, having the same lateral dimensions, using respective P-type (e.g., aluminum (Al)) implants. In contrast, the right side of FIG. 3B shows the use of separate masks (Mask 3A and 3B) to define the P-base region and the P+ shielding region, respectively. As shown at the bottom and right side of FIG. 3B, a lateral extent of the P+ shielding region is greater than a lateral extent of the P-base region. Next, in FIG. 3C, a Mask 4 is used to support the formation of N+ source regions during the implantation of N-type ions (e.g., nitrogen (N)) and a Mask 5 is used to support the formation of P+ contact regions during the implantation of P-type ions (e.g., aluminum (Al)).

Figure 3D:
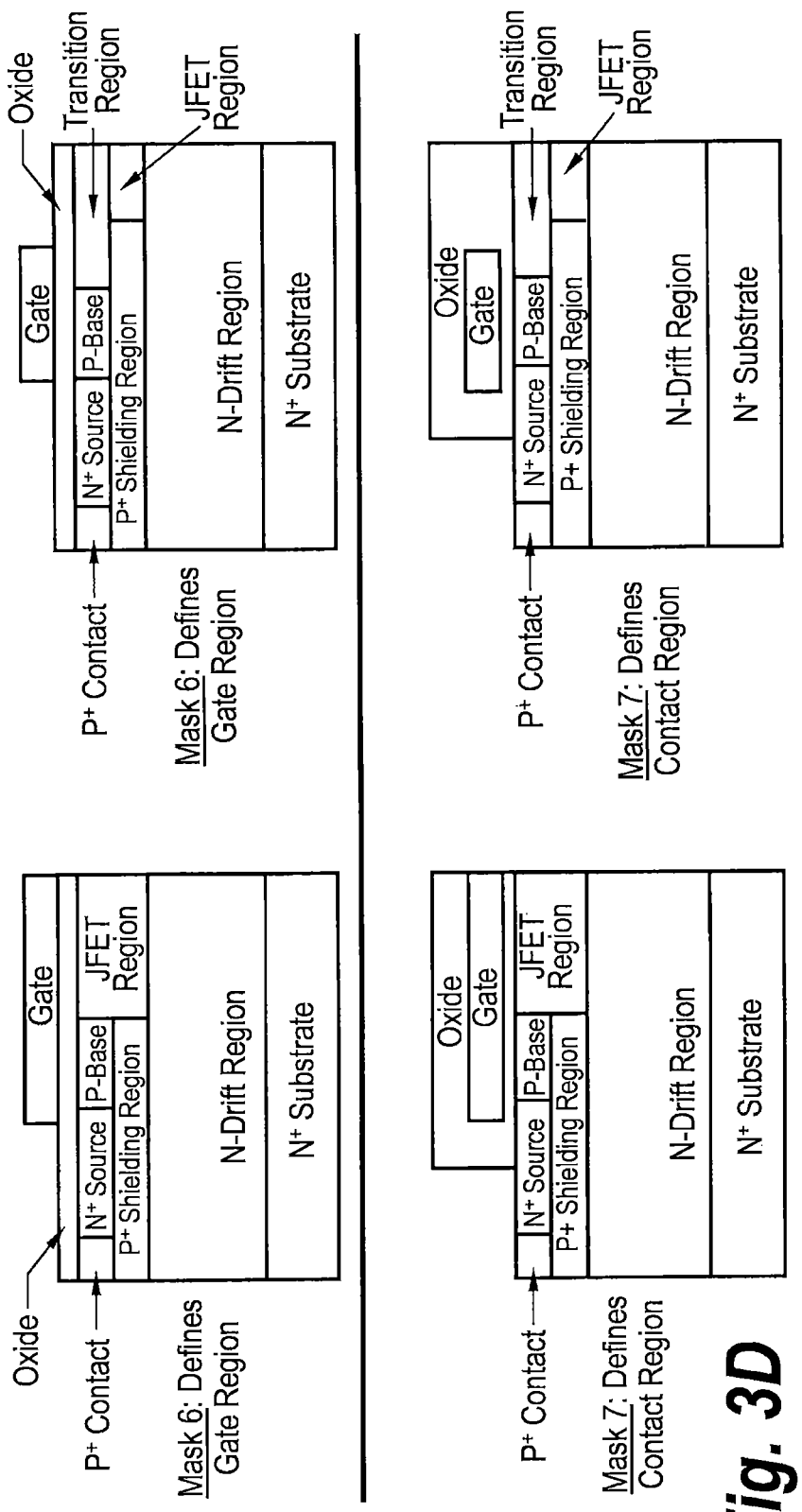
Figure 3E:
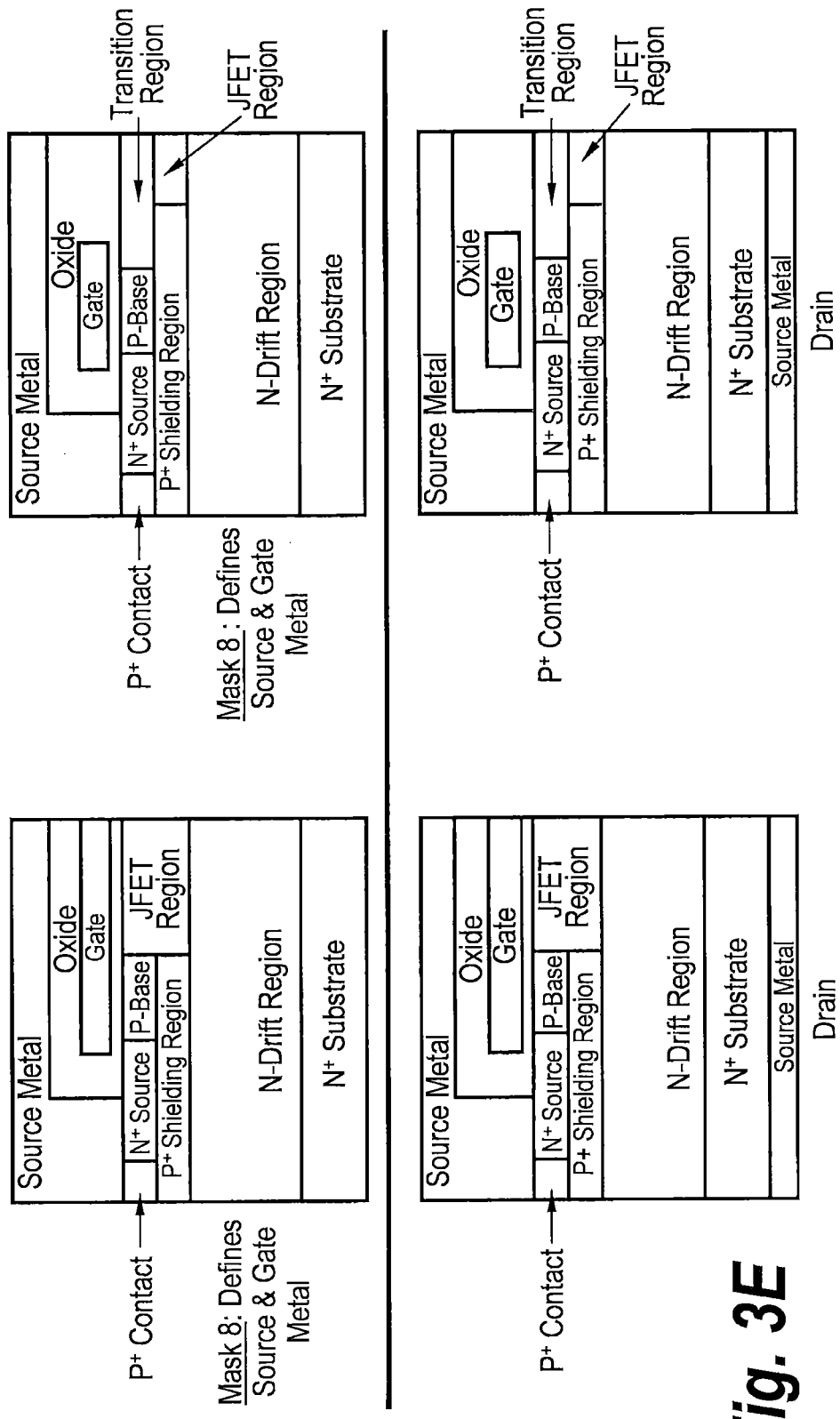

FIG. 3D illustrates the formation of gate electrodes (Gate) having long (left side) and short (right side) dimensions using respective masks (Mask 6). A Mask 7 is then used in both devices to define a source contact area (for source metal) to the P+ contact regions and the N+ source regions. Finally, as shown by FIG. 3E, a Mask 8 is used in both devices to define the source metal and gate contact metal (not shown).

Figure 4:
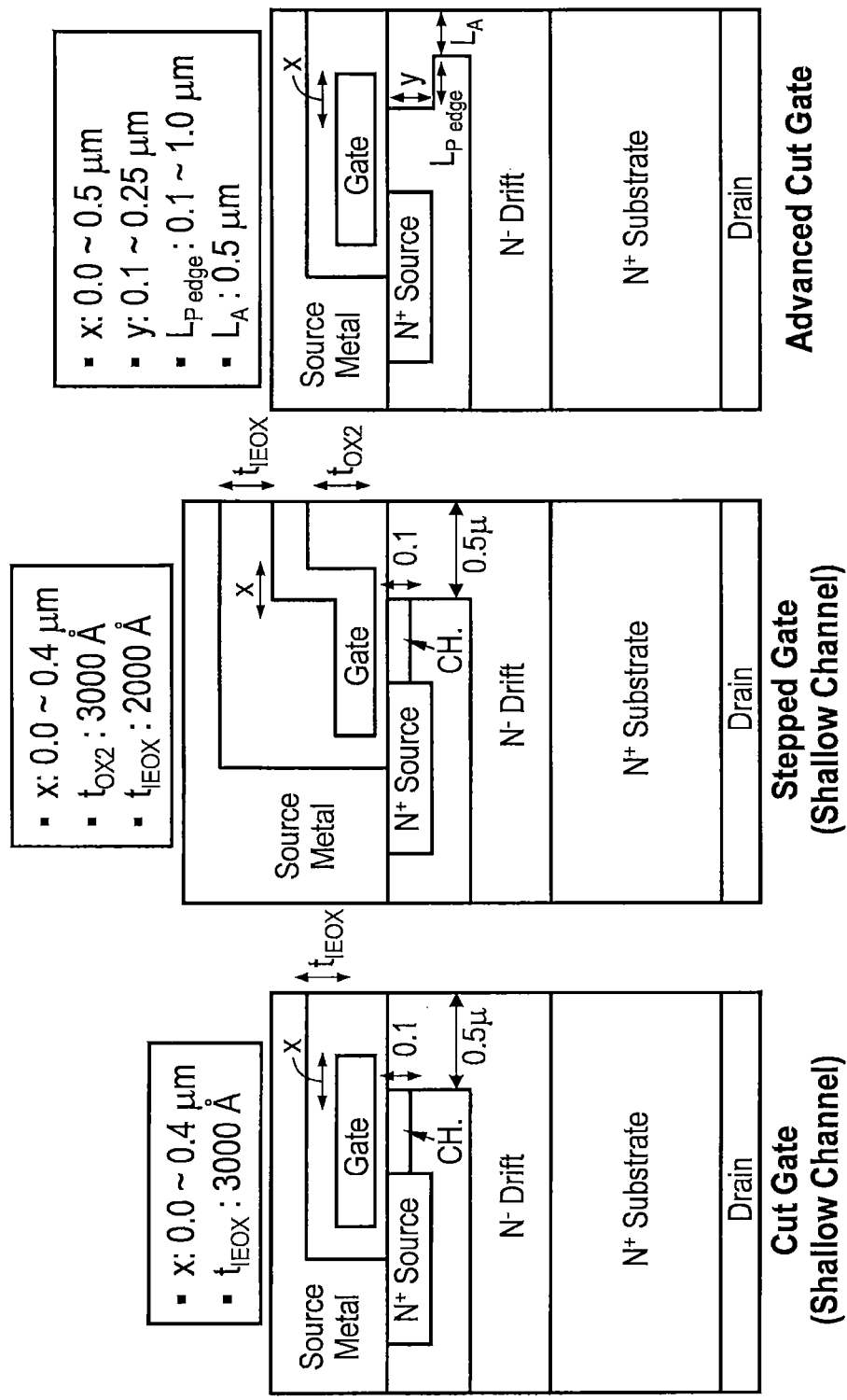
FIG. 4 includes cross-sectional views of insulated-gate field effect transistors (e.g., half-cells) according to the prior art (left, middle) and according to embodiments of the invention (right).

FIG. 4 illustrates cross-sectional views of MOSFET half-cells according to the prior art (left, middle) and according to embodiments of the invention (right). As shown on the left side of FIG. 4, a conventional MOSFET (Cut Gate, Shallow Channel) includes a relatively short gate electrode having a "drain-side" sidewall that extends 0.0-0.4 μm beyond the lateral extent of the base and shielding regions, which are aligned. A thickness of the gate insulating layer extending between the gate electrode and the source electrode (i.e., $t_{IEOX}$) is shown as 3000 Angstroms. As shown in the middle of FIG. 4, a conventional MOSFET (Stepped Gate, Shallow Channel) includes a "stepped-up" gate electrode having a "drain-side" sidewall that extends 0.0-0.4 μm beyond the lateral extent of the base and shielding regions, which are aligned. A thickness of the gate insulating layer extending between the gate electrode and the source electrode (i.e., $t_{IEOX}$) is shown as 2000 Angstroms and a thickness of the gate insulating layer extending between a stepped-up portion of the gate electrode and the underlying substrate (i.e., $t_{OX2}$) is shown as 3000 Angstroms. As shown on the right side of FIG. 4, a MOSFET (Advanced Cut Gate) according to an embodiment of the invention includes a relatively wide P+ shielding region that extends 0.1-1.0 μm beyond the lateral extent of the base region (i.e., 0.1 μm≤$L_{P\_edge}$≤1.0 μm), with a gate electrode having a "drain-side" sidewall that extends 0.0-0.5 μm beyond the lateral extent of the base region (i.e., 0.0 μm≤c≤0.5 μm) and a JFET neck region (half-cell) having a width, $L_A$, equal to 0.5 μm.

Figure 5:
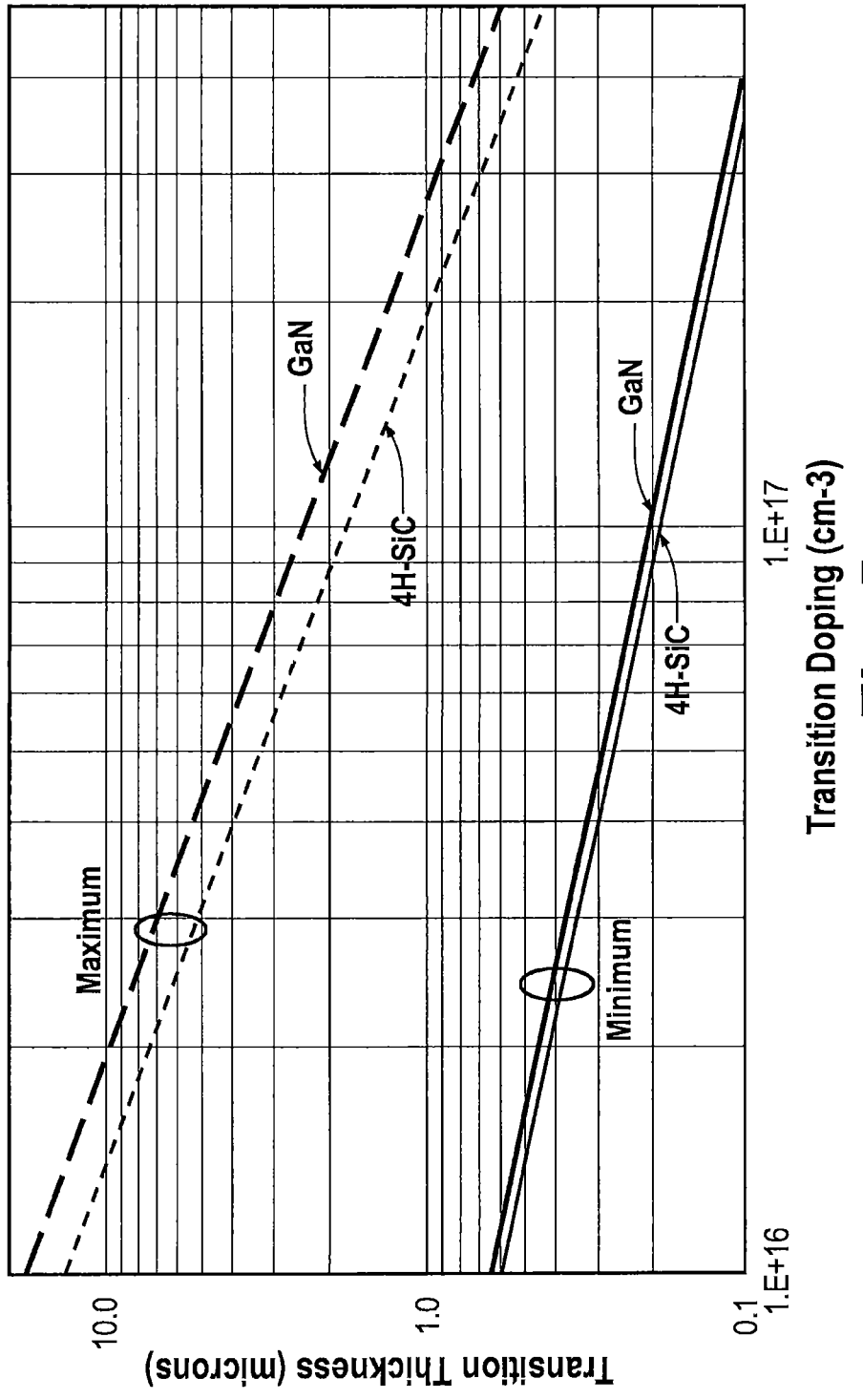
FIG. 5 is a graph illustrating a range of acceptable transition region thicknesses versus transition region doping for SiC and GaN insulated-gate field effect transistors according to embodiments of the invention.

FIG. 5 is a graph illustrating a range of acceptable transition region thicknesses (between minimum and maximum thicknesses) versus transition region doping for SiC and GaN insulated-gate field effect transistors, according to embodiments of the invention, where the transition region is illustrated as a layer 17 in FIG. 2A. According to preferred aspects of embodiments of the invention, a thickness ($t_T$) of the transition region, as measured between the first surface 13 of the substrate 15' and the P+ shielding region 7' should be: (i) greater than $0.75(2V_{bi}\varepsilon_s/qN_T)^{1/2}$, where $V_{bi}$ is the built-in potential of the P-N junction between the N-type transition region 17 and the P+ shielding region 7', $\varepsilon_s$ is the dielectric constant of the transition region 17, q is the electron charge and $N_T$ is the net first conductivity type doping concentration in the transition region 17, and (ii) less than $E_c\varepsilon_s/qN_T$, where $E_c$ is the critical electric field for breakdown in the transition region 17.

Figure 6A:
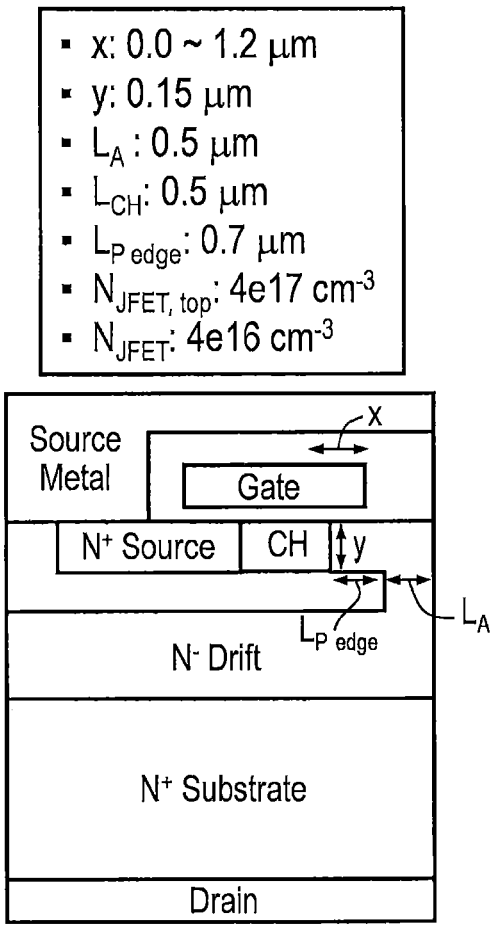
FIG. 6A is a cross-sectional view of an insulated-gate field effect transistor (e.g., half-cell) according to an embodiment of the invention.

Referring now to FIG. 6A, a half-cell of an insulated-gate field effect transistor (e.g., half-cell) according to an embodiment of the invention (see, e.g., FIG. 2B) is illustrated as including a gate electrode having a drain-side sidewall that exceeds a drain-side end of an underlying P-base region by an amount "x", where 0.0 µm≤x≤1.2 µm. A thickness of the P-base region is illustrated as y=0.15 µm and a lateral width of an underlying P+ shielding region exceeds a "length" of the P-base region (i.e., $L_{cH}$) by an amount equal to $L_{P\_edge}$, where $L_{P\_edge}$=0.7 µm and $L_{CH}$ equals 0.5 µm. A half-cell width of the JFET neck region is illustrated as $L_A$, where $L_A$ equals 0.5 µm. An N-type doping in the JFET neck region is equal to $4 \times 10^{16}$ cm$^{-3}$ and an N-type doping in the transition region ($N_{JFET,top}$) is equal to $4 \times 10^{17}$ cm$^{-3}$.

Figure 6B:
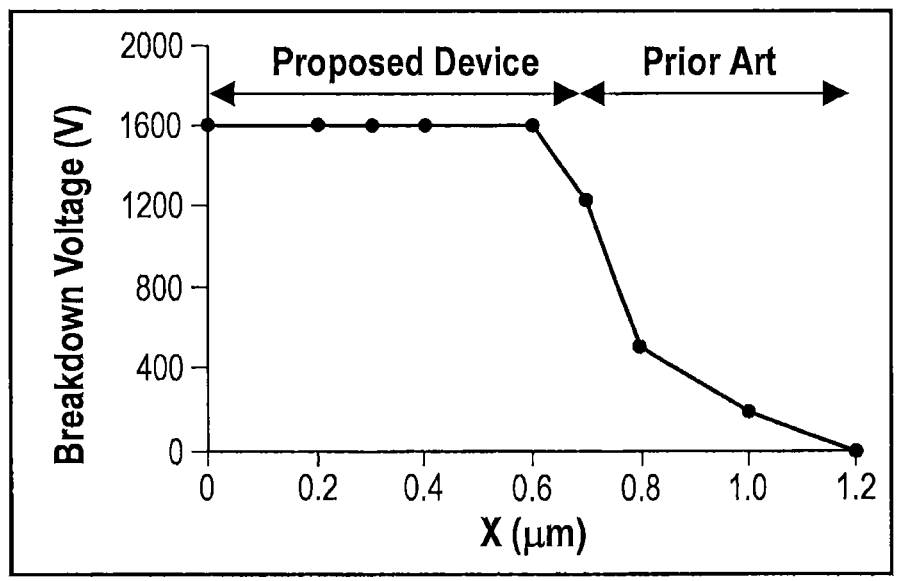
FIG. 6B is a graph of simulated breakdown voltage versus gate width extension ("X") for the device of FIG. 6A.
Figure 6C:
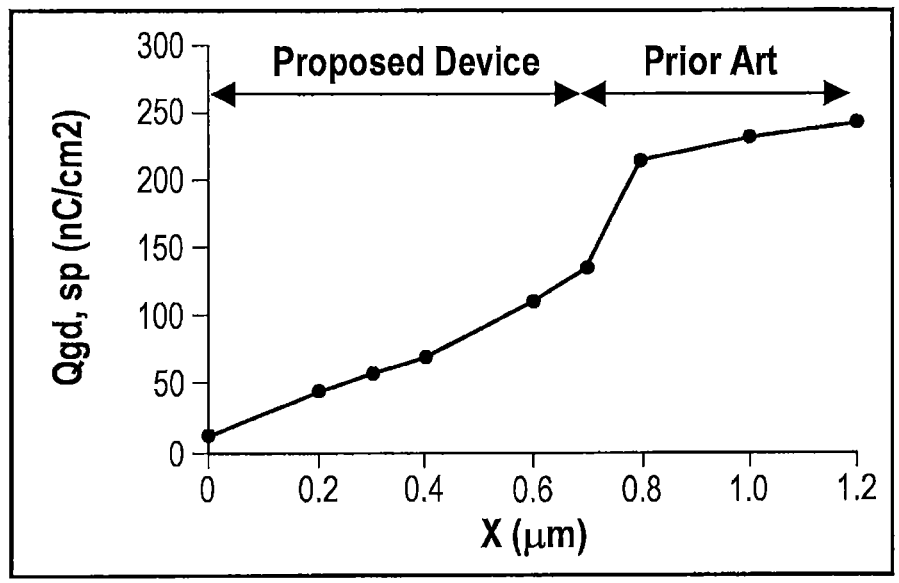
FIG. 6C is a graph of specific Qgd versus gate width extension ("X") for the device of FIG. 6A.
Figure 6D:
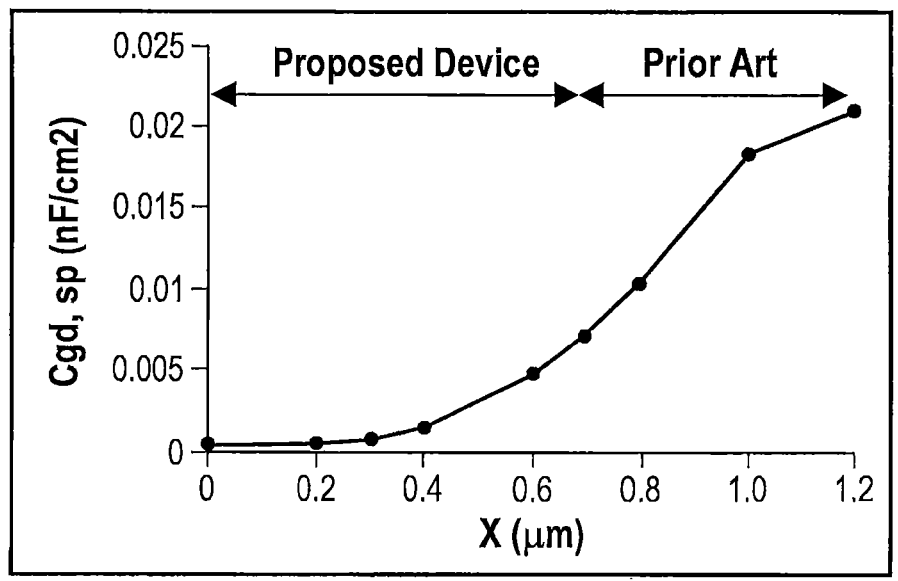
FIG. 6D is a graph of specific Cgd versus gate width extension ("X") for the device of FIG. 6A.
Figure 6E:
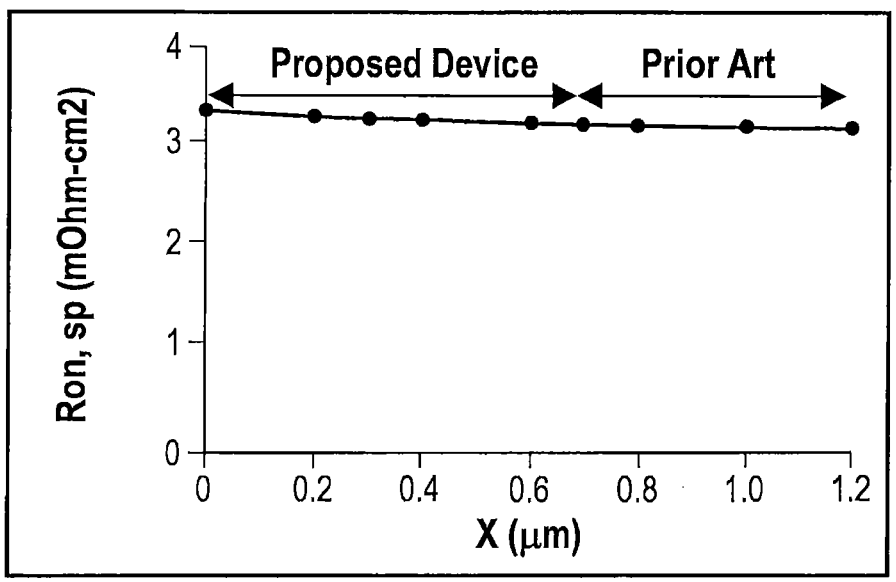
FIG. 6E is a graph of specific on-state resistance (Ron) versus gate width extension ("X") for the device of FIG. 6A.
Figure 6F:
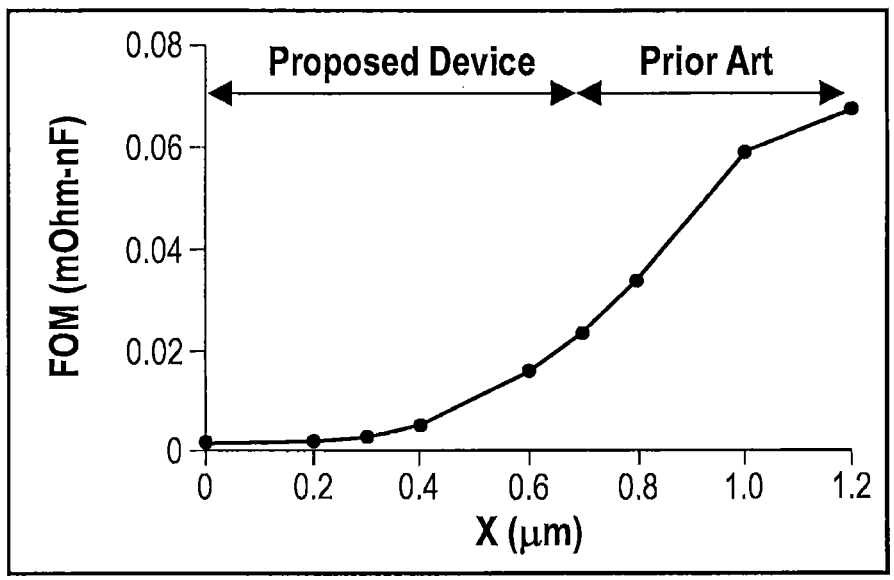
FIG. 6F is a graph of figure-of-merit (RxC) versus gate width extension ("X") for the device of FIG. 6A.
Figure 6G:
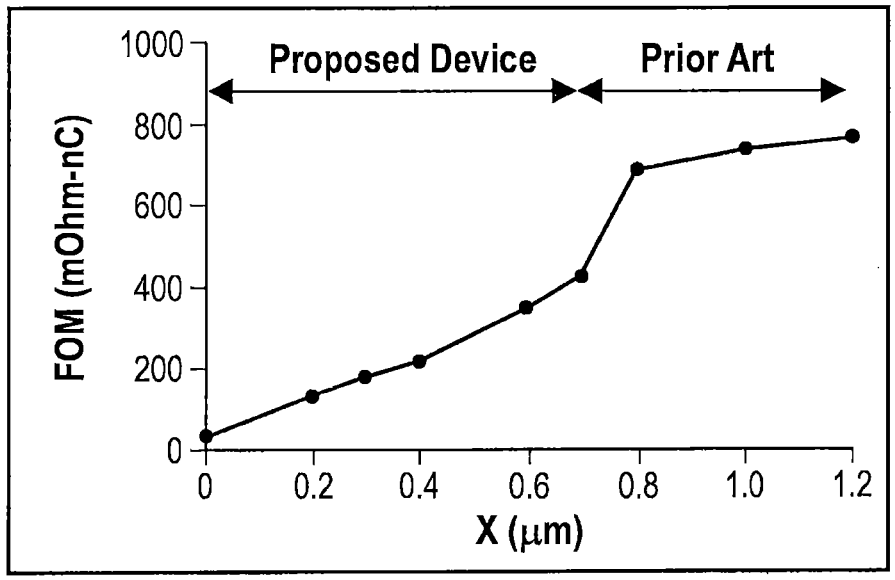
FIG. 6G is a graph of figure-of-merit (RxQ) versus gate width extension ("X") for the device of FIG. 6A.

Based on this configuration of FIG. 6A, the graph of FIG. 6B illustrates a significant fall-off in breakdown voltage as the dimension "x" exceeds 0.6 µm, for the case where $L_{P\_edge}$=0.7 µm. Furthermore, as illustrated by FIGS. 6C-6D, Qgd (gate-to-drain charge, specific) and Cgd (gate-to-drain capacitance, specific) increase significantly as "x" exceeds 0.6 µm, whereas the specific on-resistance (Ron, sp) remains relatively constant, as shown by FIG. 6E. The deterioration in performance as "x" exceeds 0.6 µm is also illustrated by FIGS. 6F-6G, where figures-of-merit (FOM) as a function of capacitance C (nano-farads nF) and charge Q (nano-coulombs nC) increase dramatically.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An insulated-gate field effect transistor, comprising:
a substrate having a semiconductor drift region of first conductivity type therein;
a semiconductor source region of first conductivity type in said substrate;
a semiconductor base region of second conductivity type in said substrate, said base region forming a first P-N junction with said source region;
a semiconductor shielding region of second conductivity type in said substrate, said shielding region extending between said drift region and said base region;
a semiconductor transition region of first conductivity type electrically coupled to said drift region, said transition region extending between a first surface of said substrate and said shielding region and forming a second P-N junction with said base region; and
an insulated gate electrode on the first surface of said substrate, said insulated gate electrode having an electrically conductive gate therein with a drain-side sidewall extending intermediate the second P-N junction and an end of said shielding region when viewed in transverse cross-section.

2. The transistor of claim 1, further comprising a JFET region of first conductivity type extending between said drift region and the first surface.

3. The transistor of claim 2, wherein said transition region forms a non-rectifying semiconductor junction with a first portion of said JFET region; and wherein a net first conductivity type doping concentration in said transition region is greater than a net first conductivity type doping concentration in the first portion of said JFET region.

4. The transistor of claim 3, wherein the first portion of said JFET region extends to the first surface; and wherein the non-rectifying semiconductor junction between said transition region and the first portion of said JFET region extends to the first surface.

5. The transistor of claim 4, wherein said transition region extends between said shielding region and the first surface, but the first portion of said JFET region does not.

6. The transistor of claim 5, wherein said JFET region forms a fourth P-N junction with said shielding region; and wherein said transition region extends between the fourth P-N junction and the first surface.

7. The transistor of claim 1, wherein the net first conductivity type doping concentration in a first portion of said transition region extending between the first surface and said shielding region is sufficiently high to prevent full depletion of the first portion of said transition region when the transistor is turned-off.

8. The transistor of claim 7, wherein the first portion of said transition region forms a third P-N junction with said shielding region; and wherein a thickness ($t_T$) of the first portion of said transition region, as measured between the first surface and said shielding region is greater than 0.75 $(2V_{bi}\varepsilon_s/qN_T)^{1/2}$, where $V_{bi}$ is the built-in potential of the third P-N junction, $\varepsilon_s$ is the dielectric constant of said transition region, q is the electron charge and $N_T$ is the net first conductivity type doping concentration in said transition region.

9. The transistor of claim 8, wherein $t_T$ is less than $E_c\varepsilon_s/qN_T$, where $E_c$ is the critical electric field for breakdown in said transition region.

10. The transistor of claim 1, further comprising a source electrode extension disposed adjacent a drain-side end of the gate and opposite said transition region; and a source electrode electrically coupled to said source region and the source electrode extension.

11. The transistor of claim 10, wherein the source electrode extension and the gate comprise the same material.

12. The transistor of claim 11, wherein a separation distance between the gate and the base region is equivalent to a separation distance between the source electrode extension and said transition region.

13. The transistor of claim 12, wherein a portion of the source electrode extension extends opposite an end of said shielding region.

14. The transistor of claim 10, wherein a portion of the source electrode extension extends opposite an end of said shielding region.

15. The transistor of claim 1, wherein the drain-side sidewall of said insulated gate electrode extends intermediate the second P-N junction and an end of said shielding region when: (i) the drain-side sidewall, (ii) the second P-N junction, and (iii) the end of said shielding region are viewed in transverse cross-section and their lateral dimensions are compared on a common lateral scale extending parallel to the first surface of said substrate.

16. An insulated-gate field effect transistor, comprising:
a substrate having a semiconductor drift region of first conductivity type therein;
a semiconductor source region of first conductivity type in said substrate;
a semiconductor base region of second conductivity type in said substrate, said base region forming a first P-N junction with said source region;
a semiconductor shielding region of second conductivity type in said substrate, said shielding region extending between said drift region and said base region;
a semiconductor transition region of first conductivity type electrically coupled to said drift region, said transition region extending between a first surface of said substrate and said shielding region and forming a second P-N junction with said base region; and an insulated gate electrode on the first surface of said substrate, said insulated gate electrode having an electrically conductive gate therein with a drain-side sidewall extending closer to the second P-N junction relative to a laterally extending distal end of said shielding region, when viewed in transverse cross-section.

17. The transistor of claim 16, further comprising a JFET region of first conductivity type extending between said drift region and the first surface.

18. The transistor of claim 17, wherein said transition region forms a non-rectifying semiconductor junction with a first portion of said JFET region; and wherein a net first conductivity type doping concentration in said transition region is greater than a net first conductivity type doping concentration in the first portion of said JFET region.

19. The transistor of claim 18, wherein the net first conductivity type doping concentration in a first portion of said transition region extending between the first surface and said shielding region is sufficiently high to prevent full depletion of the first portion of said transition region when the transistor is turned-off.

20. The transistor of claim 19, wherein the first portion of said transition region forms a third P-N junction with said shielding region; and wherein a thickness ($t_T$) of the first portion of said transition region, as measured between the first surface and said shielding region is greater than about $0.75(2V_{bi}\varepsilon_s/qN_T)^{1/2}$, where $V_{bi}$ is the built-in potential of the third P-N junction, $\varepsilon_s$ is the dielectric constant of said transition region, q is the electron charge and $N_T$ is the net first conductivity type doping concentration in said transition region.

21. The transistor of claim 20, wherein $t_T$ is less than $E_c\varepsilon_s/qN_T$, where $E_c$ is the critical electric field for breakdown in said transition region.

22. The transistor of claim 16, wherein the drain-side sidewall of said insulated gate electrode extends closer to the second P-N junction in a lateral dimension relative to a laterally extending distal end of said shielding region, when viewed in transverse cross-section and when the lateral dimensions of: (i) the drain-side sidewall, (ii) the second P-N junction, and (iii) the distal end of said shielding region are compared on a common lateral scale extending parallel to the first surface of said substrate.

* * * * *

UNITED STATES PATENT AND TRADEMARK OFFICE
CERTIFICATE OF CORRECTION

PATENT NO. : 10,355,132 B2
APPLICATION NO. : 15/925826
DATED : July 16, 2019
INVENTOR(S) : Bantval Jayant Baliga Page 1 of 1

It is certified that error appears in the above-identified patent and that said Letters Patent is hereby corrected as shown below:

In the Specification

Column 10, Line 45:
Please correct "0.0 µm≤c≤0.5 µm" to read -- 0.0 µm≤x≤0.5 µm --

Signed and Sealed this
Twenty-fourth Day of December, 2019

Andrei Iancu
*Director of the United States Patent and Trademark Office*